United States Patent [19]
Bacchetta et al.

[11] Patent Number: 5,795,821
[45] Date of Patent: Aug. 18, 1998

[54] PROCESS FOR IMPROVING THE INTERFACE UNION AMONG DIELECTRIC MATERIALS IN AN INTEGRATED CIRCUIT MANUFACTURE

[75] Inventors: Maurizio Bacchetta, Cologno Monzese; Laura Bacci, Milan; Luca Zanotti, Crema, all of Italy

[73] Assignee: SGS-Thomson Microelectronics, S.r.l., Agrate Brianza, Italy

[21] Appl. No.: 751,244

[22] Filed: Nov. 18, 1996

Related U.S. Application Data

[63] Continuation of Ser. No. 235,173, Apr. 28, 1994, abandoned.

[30] Foreign Application Priority Data

May 31, 1993 [EP] European Pat. Off. ............ 93830243

[51] Int. Cl.⁶ .................................................. H01L 21/318
[52] U.S. Cl. .................... 438/624; 438/763; 438/958; 438/216; 438/261; 438/902
[58] Field of Search ........................ 437/43, 241, 978; 257/637, 639, 640, 641, 644; 438/216, 261, 902, 958, 624, 763

[56] References Cited

U.S. PATENT DOCUMENTS

| | | |
|---|---|---|
| 4,543,271 | 9/1985 | Peters . |
| 4,618,878 | 10/1986 | Aoyama et al. . |
| 4,891,325 | 1/1990 | Hezel et al. . |
| 4,988,423 | 1/1991 | Yamoto et al. . |
| 5,061,646 | 10/1991 | Siuan et al. . |
| 5,304,829 | 4/1994 | Mori et al. . |
| 5,380,553 | 1/1995 | Loboda . |
| 5,411,917 | 5/1995 | Forouhi et al. . |
| 5,512,513 | 4/1996 | Machida et al. . |

FOREIGN PATENT DOCUMENTS

| | | |
|---|---|---|
| 327412 | 8/1989 | France . |
| 185787 | 7/1986 | Germany . |
| 4-109623 | 4/1992 | Japan . |
| 2083948 | 3/1982 | United Kingdom . |
| 2167901 | 6/1986 | United Kingdom . |

OTHER PUBLICATIONS

Wolf, S, et al "Silicon Processing for the VLSI Era: vol. 1, Process Technology", 1986, Lattice Press, pp. 273–275.
Wolf, S., "Silicon Processing for the VLSI Era: vol. 2, Process Integration", 1990 Lattice Press, pp. 182–185.
Journal of the Electrochemical Society, vol. 138, No. 10, Oct. 1991, Manchester, New Hampshire US, pp. 3019–3024, K. Fujino et al., "Doped silicon oxide deposition by atmospheric pressure and low temperature chemical vapor deposition using tetraethoxysilane and ozone".
Patent Abstracts of Japan, vol. 11, No. 77 (E–487) 7 Mar. 1987 & JP–A–61 232 646 (NEC Corp.) 16 Oct. 1986.
Patent Abstracts of Japan, vol. 16, No. 318 (E–1232) 13 Jul. 1992 & JP–A–40 92 453 9Seiko Epson Corp.) 25 Mar. 1992.
Patent Abstracts of Japan, vol. 15, No. 348 (E–1107) 4 Sep. 1991 & JP–A–31 33 131 (Mitsubishi Electric Corp.) 6 Jun. 1991.

*Primary Examiner*—George R. Fourson
*Attorney, Agent, or Firm*—David V. Carlson; Robert Iannucci; Seed and Berry LLP

[57] ABSTRACT

A method for improved adhesion between dielectric material layers at their interface during the manufacture of a semiconductor device, comprising operations for forming a first layer (1) of a dielectric material, specifically silicon oxynitride or silicon nitride, on a circuit structure (7) defined on a substrate of a semiconductor material (6) and subsequently forming a second layer (3) of dielectric material (silicon oxynitride or silicon nitride particularly) overlying the first layer (1). Between the first dielectric material layer and the second, a thin oxide layer (2), silicon dioxide in the preferred embodiment, is formed in contact therewith. This interposed oxide (2) serves an adhesion layer function between two superimposed layers (1,3).

31 Claims, 1 Drawing Sheet

PROCESS FOR IMPROVING THE INTERFACE UNION AMONG DIELECTRIC MATERIALS IN AN INTEGRATED CIRCUIT MANUFACTURE

CROSS-REFERENCE TO RELATED APPLICATION

This application is a file wrapper continuation of U.S. patent application Ser. No. 08/235,173, filed Apr. 28, 1994, now abandoned.

BACKGROUND AND SUMMARY OF THE INVENTION

This invention relates to processes for manufacturing monolithic integrated circuits which include overlaid layers of dielectric materials, in particular layers of silicon oxynitride and silicon nitride.

The adjacency of dielectric material layers having the same or different compositions is a common occurrence in today's technology at several manufacturing stages of integrated circuits. In such processes, a second layer is subsequently formed over a first layer of dielectric material. That second layer may overlap the first at a next stage so as to completely cover it, as is the case with certain passivating steps, for example. However, before forming the second layer, other operations are often carried out (such as the formation of a sacrificial layer which is then etched away, either fully or partially, or such as the partial removal of the first layer itself without using a sacrificial layer). In any case, the second dielectric layer will have bottom surface portions in direct contact with top surface portions of the first.

Dielectric material layers usually function to provide electric insulation between conductive layers and to protect underlying structures of the integrated circuit against contaminants (impurities, moisture) or impacts. Additionally, the provision of successive layers ensures protection for the device even when any one of the layers becomes damaged, e.g., by the formation of fine cracks. Therefore it is important that no regions be allowed to have less than perfect adhesion between the overlaid layers in the areas of contact. Nonetheless, some materials develop peculiar adhesion problems at the interface which are not fully understood by those skilled in the art.

These problems already exist on account of certain inherent properties of the materials. In fact, when these are placed in layer form over another material, they develop by inherent stresses a more or less marked tendency to deform the underlying structure into a more or less curved shape, which may be concave or convex, according to whether the stress is a tensile or a compressive one. Where the adjacent underlying structure is also formed of another layer of dielectric material, the magnitude of the force acting on the two layers may vary even when the stress is of the same type and perhaps of equal value, due to fact that the thicknesses are generally different. At high values of that stress, the layers tend to separate and possibly "delaminate". In general, spontaneous delamination occurs where the stress at the interface exceeds the molecular adhesion forces acting between the two layers.

This problem is aggravated by the application of external mechanical loads which add further stress, e.g., while dicing the wafer on which the circuit is formed. Other significant influences may include changes in temperature during the circuit manufacturing cycle, and environmental chemical attacks; these effects are apt to degrade the interlayer bonds.

The difficulty of achieving adhesion of the layers is further enhanced by certain methods which are commonly applied during the manufacture of an integrated circuit.

In the first place, current deposition techniques generate layers with uneven regions especially near interfaces. As those skilled in the art are well aware, the dielectric material layers are customarily formed (excepting the first, which may be grown thermally) by deposition within a reactor, using a chemical vapor deposition (CVD) technique. The chemical precursors of the elements to be deposited are reacted while in a gaseous state. The chemico-physical properties of the layer and the reaction rate are controlled by process parameters such as pressure and temperature, and by the possible ignition of plasma induced by an RF drive voltage. However, a dielectric deposited by a CVD technique is never truly uniform throughout its thickness: the first tens of nanometers have different composition characteristics from the remainder of the layer because the surface electron states of the underlying layer, where the reaction takes place, affect its properties. Especially where the plasma-assisted CVD technique is used, from plasma ignition to the moment that the reactor enters a steady state of operation, a short settling and stabilizing period must be expected before the deposition rate itself attains steady state and becomes uniform. This may introduce increased unevenness in the characteristics of the deposited layer.

On the other hand, it is possible for an interruption in the deposition of a layer to cause saturation of the surface bonds, making the adhesion of the next layer more difficult still. In addition, where the layer on which the deposition is carried out has been subjected to a previous processing step, the surface to be deposited will in general be altered. For example, in the event of a previous plasma etching step by ion bombardment (a process used for removing a sacrificial layer, for example), damage is inflicted to the surface under the mechanical and physical aspects, possibly resulting in a change of density. Further, a surface alteration under the chemical aspect may occur due to the incorporation of residual spurious chemical elements from an etching process (etching chemical elements or residues from an attached layer).

The problem is of special importance because the trend in the art is nowadays toward assembling integrated circuits into inexpensive plastic packages. A characteristic feature of plastics materials is that they are pervious and, therefore, provide no barrier against moisture, while in addition, the circuit encapsulating operation—including resin heating and subsequent cooling, with attendant release of moisture from the resin—may easily admit water into the package. This water can eventually lead to corrosion of the conductive layers, or in any event, make the integrated circuit unstable, impairing its performance.

Thus, the technology for making such devices provides for the use of silicon oxynitrides and nitrides as dielectrics. These materials do provide a barrier against migrating water, and they can also effectively prevent contamination from sodium.

On the other hand, overlaid silicon nitride and oxynitride layers—whether in the nitride/nitride or oxynitride/oxynitride or nitride/oxynitride combination—have a marked tendency to separate after deposition, because they are highly rigid materials inherently likely to build up internal stresses.

In order to improve adhesion between dielectric materials, some techniques have been developed which provide treatments of the surface of an underlying layer prior to forming the next.

One prior solution consists of bombarding the surface of a layer to be deposited with ions of an inert gas, such as argon or nitrogen, under plasma (sputtering process). In this way, the roughness of the surface is enhanced mechanically to provide increased gripping area for the reactants to be deposited, which improves adhesion. That technique applies to the instance of oxide layers deposited using tetraethylorthosilicate as the precursor (known as TEOS).

Another solution, which can be adopted where the surface of the underlying layer includes spurious chemical elements, is the provision of a cleaning step by plasma etching, using an oxygen or mixed $N_2$ and $NH_3$ plasma, or by a wet etch. In this way, it becomes possible to provide improved chemical uniformity at the interface.

All these prior approaches may also be used in succession or simultaneously for improved efficiency, and have proved adequate with certain materials. However, particularly with silicon oxynitride and silicon nitride layers, they are ineffective to prevent separation of two successive layers, which not infrequently occurs some time after deposition, as can be verified experimentally.

The present invention advantageously provides a method for causing improved adhesion at the interface between layers of dielectric materials during the manufacture of integrated circuits having multilayered structures. Specifically, the method is also effective with layers of silicon nitride and oxynitride in the nitride/nitride or oxynitride/oxynitride or nitride/oxynitride combination, thereby improving the reliability of integrated circuit devices encapsulated in plastics packages.

BRIEF DESCRIPTION OF THE DRAWINGS

The invention and its advantages can be better understood by having reference to the following description of a specific process based on the inventive principle, given by way of non-limitative example, and to the accompanying drawings, wherein.

DETAILED DESCRIPTION

In accordance with the invention, a thin layer of an oxide (silicon dioxide in the preferred embodiment) is formed at the interface between a first layer of a dielectric material and a successive layer of dielectric material, specifically silicon oxynitride and/or silicon nitride. This intermediate oxide acts as an adhesion layer between the two superimposed layers.

The method can be applied to the construction of semiconductor devices during discrete steps, e.g. passivation steps as are generally carried out in all processes.

Figure 1:
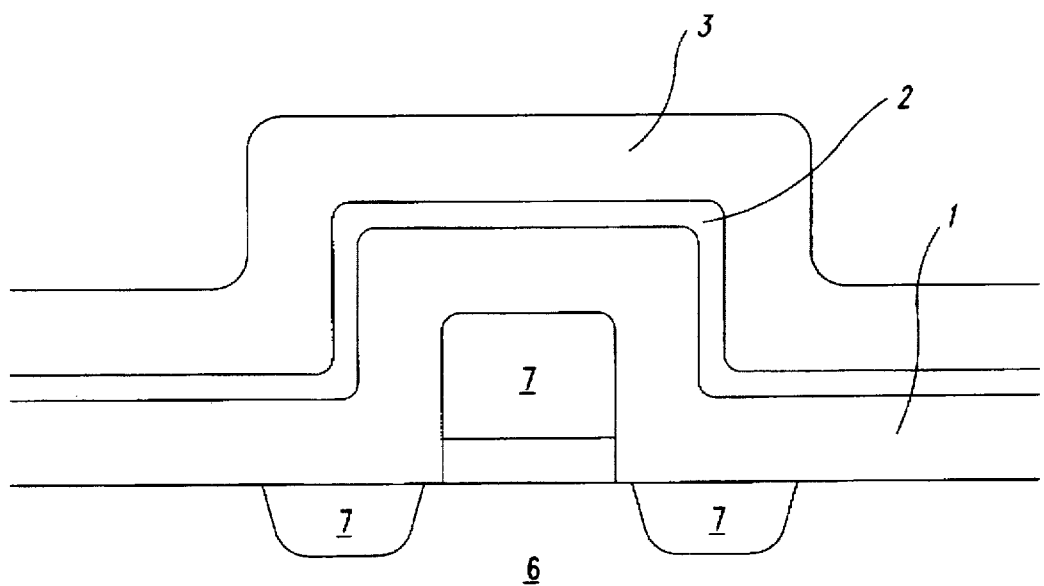
FIG. 1 shows a sectional view, not drawn to scale, of a circuit structure implementing the method of this invention.

As shown in the drawing, a method according to the invention comprises conventional initial operations in the manufacture of integrated circuits, such as the formation of a substrate 6 of a semiconductor material, e.g. monocrystalline silicon, of the circuit structure 7 sought. Then, a protective dielectric material layer 1 is usually formed over that structure, which may have conductive material layers at the top, the layer 1 conforming to the underlying structure. Thereafter, one or more dielectric material layers are formed in succession. Shown at 3 in FIG. 1 is just one of these layers. The dielectric layers 1 and 3 usually comprise silicon oxynitride or silicon nitride.

The top surface of the layer 1 may be treated, according to prior art methods and as previously noted, to promote adhesion of the layers 1 and 3.

In the preferred embodiment of the method according to this invention a thin oxide layer 2, specifically doped or non-doped silicon dioxide ($SiO_2$), is interposed before the second dielectric layer 3 is formed.

The deposition of the dielectric layer 3 is followed by optional steps, not shown in the drawing, to complete the formation of the device, in accordance with conventional methods.

The layer 2 provides an adhesive layer between the layers 1 and 3, and serves no specific passivation function. It should be thin, its thickness dimension being preferably on the order of a few tens of nanometers, specifically within the range of 5 to 50 nm.

The decision to have the silicon dioxide doped, usually with boron or phosphorous, or left undoped will depend on the particular process that includes this adhesion step. Doping with boron to yield BSG (BoroSilicate Glass) improves the reflow capability of the layer by application of heat; silicon dioxide doped with phosphorous (PSG or PhosphoSilicate Glass) serves a barrier function against contaminants (by gettering). In any event, the amount of dopant used is normally kept fairly low.

The formation of silicon dioxide is preferably obtained by deposition using a CVD technique, either under a low pressure (LPCVD) or atmospheric pressure (APCVD) or a subatmospheric pressure (SACVD), or alternatively by plasma activation (PECVD=Plasma-Enhanced CVD). The chemical precursors used may also be varied: tetraethylorthosilicate (TEOS) and silane ($SiH_4$) are the silicon sources most widely in use. Molecular oxygen ($O_2$), optionally together with ozone ($O_3$) and occasionally with nitrogen oxides ($NO_2$, NO), are instead used for oxygen. The chemico-physical characteristics of the resultant layer depend on the deposition conditions, which should take the process into account to which it is subjected, and which dictate the precursors to be used. A major advantage, well recognized by those of ordinary skill in the art, of deposition from silane is the low temperature that can be used during the process (below 500° C). The silicon dioxide deposited from TEOS has better layer properties than that from silane (excellent uniformity, close conformation with the underlying structure).

Doped (with boron, phosphorous, or both) silicon dioxide is commonly obtained directly upon CVD deposition of the layer, by also loading dopant-supplying molecules as reactants into the reactor. Specifically, diborane ($B_2H_6$) or trimethylborate (TMB) are used for borosilicates, and phosphine ($PH_3$) or trimethylphosphite (TMPi) or triethylphosphate (TEP) or trimethylphosphate (TMPa) for phosphosilicates. Of course, boron and phosphorous doping may be combined.

The adhesive properties of the oxide layer, which is interposed between two dielectric layers in accordance with this invention, have been verified experimentally. Using scanning or transmission electron microscopy (SEM, TEM), it is found that the presence of the layer of silicon dioxide is especially effective to prevent the two dielectric layers from separating. The effectiveness of the material has been verified both for doped dioxide and undoped dioxide. The exact reason why that thin layer improves the adhesion of dielectrics is yet not understood from the physical standpoint.

The adhesion function can be generally served by a thin layer of a not strictly stoichiometric silicon oxide (i.e., $Si_xO_{2-x}$ not $SiO_2$), and experimental tests point to the likelihood that a thin layer of an oxide other than of silicon, e.g. of titanium, may also be used.

It should also be considered that, while the materials to which the method described is preferably applied are silicon oxynitrides and silicon nitride, it may also prove effective with other dielectrics.

Figure 2:
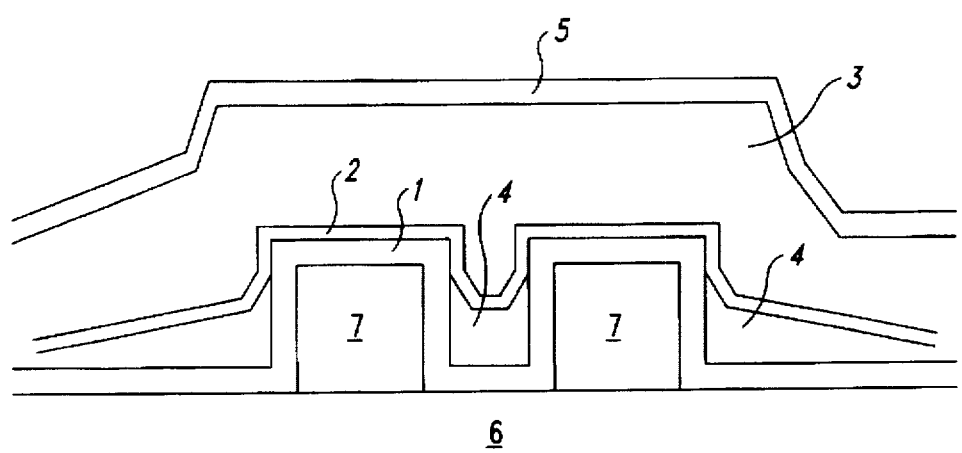
FIG. 2 shows a sectional view of an application of the invention to a specific process.

In a typical example, an application of the process according to the present invention will be described in relation to a final passivation process, as used for the manufacture of an EPROM memory encapsulated in a plastic package (i.e. flash EPROM or OTP EPROM). FIG. 2 shows schematically a cross section of such a device, as obtained at the end of the process (the elements identical to the elements of FIG. 1 are identically designated). The final passivation stack of FIG. 2, according to the invention, includes an oxide adhesion thin layer 2 to improve adhesion between two dielectric layers 1 and 3, where they are in contact. The dielectric layers 1 and 3, in this example, are silicon oxynitride layers. The formation of the passivation layers over a structure 7 like EPROM cells (including metal strips on the top) starts with a first oxynitride layer 1 (e.g. 0.4 μm thick) completely covering the structure. A material with a low viscosity is then used to planarize the upper surface, as well known by the skilled in the art. Typically a SOG, a silane precursor in an organic liquid, is spun onto the entire surface, and then cured. A partial etch-back of the SOG leaves it only in the deeper zones (shown as 4 in FIG. 2). An oxide adhesion layer 2 is then formed over the portion of the first oxynitride layer not covered by the SOG, and over the residual SOG, before the formation of a second oxynitride layer 3 (e.g. 1.2 μm thick). In this example, the oxide adhesion layer 2 is an undoped silicon dioxide deposited by PECVD using TEOS as precursor. Finally, a top PSG layer 5 is a standard requirement in a typical passivation process.

The final passivation scheme has therefore the following sequence of steps:

1) 0.4 μm oxynitride deposition;
2) 0.4 μm SOG spinning+SOG curing (425° C., 45 min in $N_2$);
3) SOG mini-bake for 60 seconds at 390° C. (set point temperature) to dry SOG just before deposition;
4) cooling for 90 seconds;
5) SOG partial etch-back for 1750 A (69 sec total etch time+20 sec Ar sputter);
6) TEOS undoped (USG) oxide adhesion thin layer deposition (about 350 A thick, 3 sec of deposition), between the two oxynitride films;
7) 1.2 μm oxynitride+0.4 μm TEOS PSG depositions.

All the deposition on the process are in this example plasma enhanced. It has to be noticed that an Ar sputter step is maintained (also if it does not solve the decohesion problems, as already discussed), to clean the surface before the deposition of the thin oxide layer and to smooth the top corners of the first oxynitride layers.

The specific process conditions and film characteristics for the formation of the oxide adhesion thin layer are described in the following tables, for forming an adhesion layer of 350A:

TABLE 1

| film | plasma power (W) | dep. temp. (°C.) | spacing (mils) | pressure (Torr) | TEOS (close loop control) sccm | O2 sccm |
|---|---|---|---|---|---|---|
| PE-TEOS USG | 440 | 390 | 190 | 9.0 | 930 | 470 |

TABLE 2

| film | thick unif. % (ww & wtow) | RI | stress (dyne/cm$^2$) | step-cov (1:1 A.R.) | depos. rate (A/min) | moisture resistance (%) | density (g/cm$^3$) |
|---|---|---|---|---|---|---|---|
| PE-TEOS USG | 2 & 3 3σ | 1.45 ± 0.1 | 2.3 E8 compr. | 50% | 7600 | 1.7 | 2.12 |

Table 1 gives the parameters of the process. The deposition of the TEOS silicon dioxide has a duration of about 3 seconds and is preceded by 16 second of gas stabilization. The characteristics of the film are shown in table 2.

This has experimentally demonstrated that the introduction of the interface adhesion layer is successful both from the morphological (adhesion improvement) and electrical (no charge loss) points of view, if compared with samples without the silicon dioxide adhesion layer. Construction analysis can be used to confirm the degree of adhesion of the second oxynitride layer to the underlying surface, and therefore to the first oxynitride layer. Moreover, additional electrical tests show no significant difference between a process without the thin oxide and the process described. Therefore no negative effect on the passivation quality nor on the dielectrics reliability can be found. Killer integrity test at wafer level can be done to assure passivation integrity. No problems arising from a "stufa" test (4 hours at 425° C.) can be found.

Besides, the addition of this cohesion step does not affect the net throughput of the system.

A thin thermal TEOS-$O_3$ thin oxide gives also the same positive results as adhesion layer.

Thus, the method of this invention leads to an advantageous improvement of the adhesion between layers of dielectric materials, as is observed experimentally. It may be used to seal together layers in succession, thereby indirectly improving their insulative and protective effect on devices.

This effect is specially noticeable with silicon oxynitrides and silicon nitrides, which were at the root of the major problems encountered with other techniques.

It will be appreciated that the above embodiment has been described by way of illustration and not of limitation, and that many changes may be made thereunto without departing from the invention scope.

In fact, the embodiment of the invention described may be applied to all those processes wherein portions of dielectric material layers are to be superimposed. Additionally, the dissimilar characters of the CVD techniques used to form the adhesion oxide layer bear no significant influence on the adhesive property of the thin oxide layer.

Processing may continue with conventional step to complete fabrication, e.g. deposition and planarization of further interlevel dielectric, contact etch, metal deposition and etch, via patterning, protective overcoat deposition, or only etching contact pad apertures, etc. See generally VLSI TECHNOLOGY (2nd ed. Sze 1988); G. Anner, PLANAR PROCESSING PRIMER (1990); R. Castellano, SEMICONDUCTOR DEVICE PROCESSING (1991); W. Runyan & K. Bean, SEMICONDUCTOR INTEGRATED CIRCUIT PROCESSING TECHNOLOGY (1990); and the annual proceedings of the IEDM conferences, all of which are hereby incorporated by reference.

What is claimed is:

1. A method for improved adhesion between dielectric material layers at the interface thereof, during the manufacture of a semiconductor device, comprising:

forming a first layer of a nitride based dielectric material over at least a portion of a structure defined on a substrate of a semiconductor material;

forming a second layer of nitride based dielectric material overlying at least a portion of said first layer; and forming an oxide adhesion promoting layer in at least one region between said first and second layers of dielectric materials, in contact with both, the thickness of said layer being within the 5 to 50 nm range.

2. A method according to claim 1, wherein said adhesion promoting layer is silicon dioxide.

3. A method according to claim 2, wherein said silicon dioxide is doped with phosphorus.

4. A method according to claim 2, wherein said silicon dioxide is doped with boron.

5. A method according to claim 1, wherein said adhesion promoting layer is formed using a chemical vapor deposition technique.

6. A method according to claim 2, wherein said silicon dioxide layer is formed by chemical vapor deposition using, as chemical precursors of silicon, a material selected from the group consisting of tetraethylorthosilicate and silane, and as oxygen sources, a material selected from the group consisting of molecular oxygen, molecular oxygen mixed with ozone, nitrogen oxide, and nitrogen protoxide.

7. A method according to claim 3, wherein said silicon dioxide layer is formed by chemical vapor deposition using, as chemical precursors of silicon, a material selected from the group consisting of tetraethylorthosilicate and silane, and as oxygen sources, a material selected from the group consisting of molecular oxygen, molecular oxygen mixed with ozone, nitrogen oxide, and nitrogen protoxide; and wherein as dopant sources for said silicon dioxide a material selected from the group consisting of phosphine, trimethylphosphite, triethylphosphate, and trimethylphosphate is used for phosphorus doping.

8. A method according to claim 4, wherein said silicon dioxide layer is formed by chemical vapor deposition using, as chemical precursors of silicon, a material selected from the group consisting of tetraethylorthosilicate and silane, and as oxygen sources, a material selected from the group consisting of molecular oxygen, molecular oxygen mixed with ozone, nitrogen oxide, and nitrogen protoxide; and wherein as dopant sources for said silicon dioxide a material selected from the group consisting of diborane and trimethylborate is used for boron doping.

9. A method for increasing adhesion between two layers of a silicon compound containing nitrogen, during the manufacture of a semiconductor device, comprising:

forming a first layer of a first silicon nitride compound over at least a portion of a structure defined on a substrate of a semiconductor material;

forming a silicon dioxide layer over said first layer of said first silicon nitride compound and in contact therewith in at least one region, the thickness of said silicon dioxide being less than both the thicknesses of said first and second layers of first and second silicon nitride compounds; and forming a second layer of a second silicon nitride compound overlaying at least a portion of said first layer of said first silicon nitride compound and in contact with said silicon dioxide layer at least herein, wherein said silicon dioxide layer promotes adhesion between said first and second layers of first and second silicon nitride compounds at least in a region wherein they are overlapping; wherein the thickness of said silicon dioxide layer is in the range between 5 and 50 nm.

10. A method according to claim 9, wherein the formation of said silicon dioxide layer is obtained by deposition using a chemical vapor deposition (CVD) technique with tetraethylorthosilicate (TEOS) as chemical precursor.

11. A method according to claim 9, wherein the formation of said silicon dioxide layer is obtained by deposition using a chemical vapor deposition (CVD) technique with silane as chemical precursor.

12. A method according to claim 9, wherein said silicon dioxide is doped with phosphorus.

13. A method according to claim 9, wherein said silicon dioxide is doped with boron.

14. A method according to claim 9, wherein said silicon dioxide is formed by thermal process using TEOS-$O_3$.

15. A method according to claim 9, wherein said first and second silicon nitride compounds are constituted by either a silicon oxynitride or stoichiometric silicon nitride.

16. A method for forming an integrated EPROM device with an improved adhesion between silicon oxynitride passivation layers, comprising:

forming, on a substrate of a semiconductor material, a structure including metal strips, metal pads and polysilicon gates on the top;

depositing a first silicon oxynitride layer;

forming a SOG layer filling only the deeper regions to planarize the surface, by means of successively spinning, curing and partially etching the SOG material to partially expose said first silicon oxynitride layer;

forming a silicon dioxide layer, contacting said SOG layer and said first silicon oxynitride layer in the region wherein it is exposed, the thickness of said silicon dioxide being less than both the thicknesses of said first and second silicon oxynitride layers;

depositing a second silicon oxynitride layer, wherein the adhesion between said first and second silicon oxynitride layers is improved.

17. A method according to claim 16, wherein the formation of said silicon dioxide layer is obtained by deposition using a chemical vapor deposition (CVD) technique with tetraethylorthosilicate (TEOS) as chemical precursor.

18. A method according to claim 17, wherein said chemical vapor deposition is a plasma enhanced CVD (PE-CVD) technique.

19. A method according to claim 16, wherein the formation of said silicon dioxide layer is obtained by deposition using a chemical vapor deposition (CVD) technique with silane as chemical precursor.

20. A method according to claim 19, wherein is used a plasma enhanced CVD (PE-CVD) technique.

21. A method according to claim 16, wherein said silicon dioxide is doped with phosphorus.

22. A method according to claim 16, wherein said silicon dioxide is doped with boron.

23. A method according to claim 16, wherein said silicon dioxide is formed by thermal process using TEOS-$O_3$.

24. A method for forming an integrated EPROM device with an improved adhesion between silicon oxynitride passivation layers, comprising:

forming, on a substrate of a semiconductor material, a structure including metal strips, metal pads and polysilicon gates on the top;

depositing about 0.4 μm of a first silicon oxynitride layer;

forming a SOG layer filling only the deeper regions to planarize the surface, by means of successively spinning about 0.4 μm of SOG, curing the SOG material and etching about 1750 Å of said SOG material to partially expose said first silicon oxynitride layer;

forming about 350 Å of a silicon dioxide layer, contacting said SOG layer and said first silicon oxynitride layer in the region wherein it is exposed;

depositing about 1.2 μm of a second silicon oxynitride layer;

whereby the adhesion between said first and second silicon oxynitride layers is improved.

25. A method according to claim 24, wherein the formation of said silicon dioxide layer is obtained by deposition using a plasma enhanced chemical vapor deposition (PECVD) technique with tetraethylorthosilicate (TEOS) as chemical precursor.

26. A method according to claim 24, wherein the formation of said silicon dioxide layer is obtained by deposition using a plasma enhanced chemical vapor deposition (PECVD) technique with silane as chemical precursor.

27. A method according to claim 24, wherein said silicon dioxide is formed by thermal process using TEOS-$O_3$.

28. The method of claim 1, wherein said adhesion promoting layer has a non-stoichiometric composition.

29. The method of claim 9, wherein said silicon dioxide layer has a non-stoichiometric composition.

30. The method of claim 16, wherein said silicon dioxide layer has a non-stoichiometric composition.

31. The method of claim 24, wherein said silicon dioxide layer has a non-stoichiometric composition.

* * * * *